(12) United States Patent
Raring et al.

(10) Patent No.: US 8,314,429 B1
(45) Date of Patent: Nov. 20, 2012

(54) MULTI COLOR ACTIVE REGIONS FOR WHITE LIGHT EMITTING DIODE

(75) Inventors: James Raring, Goleta, CA (US); Rajat Sharma, Goleta, CA (US); Christiane Poblenz, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 12/880,803

(22) Filed: Sep. 13, 2010

Related U.S. Application Data

(60) Provisional application No. 61/242,372, filed on Sep. 14, 2009.

(51) Int. Cl.
*H01L 31/0256* (2006.01)

(52) U.S. Cl. ....... 257/76; 257/13; 257/90; 257/E33.051; 257/E33.013

(58) Field of Classification Search ................ 257/76, 257/13, 30, E33.051, E33.013
See application file for complete search history.

(56) References Cited

U.S. PATENT DOCUMENTS

| | | | |
|---|---|---|---|
| 4,341,592 A | 7/1982 | Shortes et al. | |
| 4,860,687 A | 8/1989 | Frijlink | |
| 5,334,277 A | 8/1994 | Nakamura | |
| 5,527,417 A | 6/1996 | Lida et al. | |
| 5,607,899 A | 3/1997 | Yoshida et al. | |
| 5,632,812 A | 5/1997 | Hirabayashi | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 6,069,394 A | 5/2000 | Hashimoto et al. | |
| 6,147,953 A | 11/2000 | Duncan | |
| 6,153,010 A | 11/2000 | Kiyoku et al. | |
| 6,379,985 B1 | 4/2002 | Cervantes et al. | |
| 6,451,157 B1 | 9/2002 | Hubacek | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,814,811 B2 | 11/2004 | Ose | |
| 6,833,564 B2 | 12/2004 | Shen et al. | |
| 6,858,081 B2 | 2/2005 | Biwa et al. | |

(Continued)

FOREIGN PATENT DOCUMENTS

JP 2007-173467 A 7/2007

OTHER PUBLICATIONS

U.S. Appl. No. 12/497,289, filed Jul. 2, 2009, Raring et al.

(Continued)

*Primary Examiner* — Long Pham

(74) *Attorney, Agent, or Firm* — Kilpatrick Townsend & Stockton LLP

(57) ABSTRACT

A light emitting diode device has a gallium and nitrogen containing substrate with a surface region with an epitaxial layer overlying the surface region. Preferably the device includes a first active region overlying the surface and configured to emit first electromagnetic radiation having a wavelength ranging from about 405 nm to 490 nm; a second active region overlying the surface and configured to emit second electromagnetic radiation having a wavelength ranging from about 491 nm to about 590 nm; and a third region overlying the surface region and configured to emit third electromagnetic radiation having a wavelength ranging from about 591 nm to about 700 nm. A p-type epitaxial layer covers the first, second, and third active regions.

16 Claims, 7 Drawing Sheets

U.S. PATENT DOCUMENTS

| | | | |
|---|---|---|---|
| 6,920,166 | B2 | 7/2005 | Akasaka et al. |
| 7,053,413 | B2 | 5/2006 | D'Evelyn et al. |
| 7,063,741 | B2 | 6/2006 | D'Evelyn |
| 7,220,324 | B2 | 5/2007 | Baker et al. |
| 7,303,630 | B2 | 12/2007 | Motoki et al. |
| 7,312,156 | B2 | 12/2007 | Granneman et al. |
| 7,323,723 | B2 | 1/2008 | Ohtsuka et al. |
| 7,338,828 | B2 | 3/2008 | Imer et al. |
| 7,390,359 | B2 | 6/2008 | Miyanaga et al. |
| 7,489,441 | B2 | 2/2009 | Scheible et al. |
| 7,555,025 | B2 | 6/2009 | Yoshida |
| 7,727,332 | B2 | 6/2010 | Habel et al. |
| 7,749,326 | B2 | 7/2010 | Kim et al. |
| 7,806,078 | B2 | 10/2010 | Yoshida |
| 7,968,864 | B2 | 6/2011 | Akita et al. |
| 8,017,932 | B2 | 9/2011 | Okamoto et al. |
| 2002/0050488 | A1 | 5/2002 | Nikitin et al. |
| 2002/0085603 | A1 | 7/2002 | Okumura |
| 2003/0000453 | A1 | 1/2003 | Unno et al. |
| 2003/0001238 | A1 | 1/2003 | Ban |
| 2003/0012243 | A1 | 1/2003 | Okumura |
| 2003/0020087 | A1 | 1/2003 | Goto et al. |
| 2003/0140846 | A1 | 7/2003 | Biwa et al. |
| 2003/0216011 | A1 | 11/2003 | Nakamura et al. |
| 2004/0025787 | A1 | 2/2004 | Selbrede et al. |
| 2004/0060518 | A1 | 4/2004 | Nakamura et al. |
| 2004/0151222 | A1 | 8/2004 | Sekine |
| 2004/0196877 | A1 | 10/2004 | Kawakami et al. |
| 2005/0040384 | A1 | 2/2005 | Tanaka et al. |
| 2005/0072986 | A1 | 4/2005 | Sasaoka |
| 2005/0168564 | A1 | 8/2005 | Kawaguchi et al. |
| 2005/0224826 | A1 | 10/2005 | Keuper et al. |
| 2005/0229855 | A1 | 10/2005 | Raaijmakers |
| 2006/0037529 | A1 | 2/2006 | D'Evelyn |
| 2006/0060131 | A1 | 3/2006 | Atanackovic |
| 2006/0078022 | A1 | 4/2006 | Kozaki et al. |
| 2006/0079082 | A1 | 4/2006 | Bruhns et al. |
| 2006/0086319 | A1 | 4/2006 | Kasai et al. |
| 2006/0118799 | A1 | 6/2006 | D'Evelyn et al. |
| 2006/0144334 | A1 | 7/2006 | Yim et al. |
| 2006/0189098 | A1 | 8/2006 | Edmond |
| 2006/0193359 | A1 | 8/2006 | Kuramoto |
| 2006/0216416 | A1 | 9/2006 | Sumakeris et al. |
| 2006/0256482 | A1 | 11/2006 | Araki et al. |
| 2007/0110112 | A1 | 5/2007 | Sugiura |
| 2007/0217462 | A1 | 9/2007 | Yamasaki |
| 2008/0087919 | A1 | 4/2008 | Tysoe et al. |
| 2008/0092812 | A1 | 4/2008 | McDiarmid et al. |
| 2008/0095492 | A1 | 4/2008 | Son et al. |
| 2008/0124817 | A1 | 5/2008 | Bour et al. |
| 2008/0164578 | A1 | 7/2008 | Tanikella et al. |
| 2008/0173735 | A1 | 7/2008 | Mitrovic et al. |
| 2008/0191223 | A1 | 8/2008 | Nakamura et al. |
| 2008/0217745 | A1 | 9/2008 | Miyanaga et al. |
| 2008/0232416 | A1 | 9/2008 | Okamoto et al. |
| 2008/0285609 | A1 | 11/2008 | Ohta et al. |
| 2008/0291961 | A1 | 11/2008 | Kamikawa et al. |
| 2008/0303033 | A1 | 12/2008 | Brandes |
| 2008/0315179 | A1 | 12/2008 | Kim et al. |
| 2009/0058532 | A1 | 3/2009 | Kikkawa et al. |
| 2009/0078944 | A1 | 3/2009 | Kubota et al. |
| 2009/0081857 | A1 | 3/2009 | Hanser et al. |
| 2009/0141765 | A1 | 6/2009 | Kohda et al. |
| 2009/0159869 | A1 | 6/2009 | Ponce et al. |
| 2009/0229519 | A1 | 9/2009 | Saitoh |
| 2009/0250686 | A1 | 10/2009 | Sato et al. |
| 2009/0267100 | A1 | 10/2009 | Miyake et al. |
| 2009/0301387 | A1 | 12/2009 | D'Evelyn |
| 2009/0301388 | A1 | 12/2009 | D'Evelyn |
| 2009/0309110 | A1 | 12/2009 | Raring et al. |
| 2009/0309127 | A1 | 12/2009 | Raring et al. |
| 2009/0320744 | A1 | 12/2009 | D' Evelyn |
| 2010/0001300 | A1 | 1/2010 | Raring et al. |
| 2010/0003492 | A1 | 1/2010 | D'Evelyn |
| 2010/0006873 | A1* | 1/2010 | Raring et al. .......... 257/90 |
| 2010/0025656 | A1 | 2/2010 | Raring et al. |
| 2010/0031875 | A1 | 2/2010 | D'Evelyn |
| 2010/0096615 | A1 | 4/2010 | Okamoto et al. |
| 2010/0140745 | A1 | 6/2010 | Khan et al. |
| 2010/0151194 | A1 | 6/2010 | D'Evelyn |
| 2010/0295054 | A1 | 11/2010 | Okamoto et al. |
| 2010/0316075 | A1 | 12/2010 | Raring et al. |
| 2011/0057167 | A1 | 3/2011 | Ueno et al. |
| 2011/0064100 | A1 | 3/2011 | Raring et al. |
| 2011/0064101 | A1 | 3/2011 | Raring et al. |
| 2011/0064102 | A1 | 3/2011 | Raring et al. |
| 2011/0103418 | A1 | 5/2011 | Hardy et al. |
| 2011/0180781 | A1* | 7/2011 | Raring et al. .......... 257/13 |
| 2011/0186874 | A1 | 8/2011 | Shum |
| 2011/0186887 | A1 | 8/2011 | Trottier et al. |
| 2011/0247556 | A1 | 10/2011 | Raring et al. |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993," IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Gardner et al. "Blue-emitting InGaN-GaN double-heterostructure light-emitting diodes reaching maximum quantum efficiency above 200 A/ cm2", Applied Physics Letters 91, 243506 (2007).

hap ://techon.nikkeibp. co jp/english/NEWS$_{13}$ EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates,"2007, Journal of Japanese Applied Physics, vol. 40, pp. 925-927.

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas via Metalorganic Vapor Phase Epitaxy," 1998, Journal of Electronic Materials, vol. 27, No. 4, pp. 233-237.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Purvis, "Changing the Crystal Face of Gallium Nitride." The Advance Semiconductor Magazine, vol. 18, No. 8, Nov. 2005.
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Shchekin et al., "High Performance Thin-film Flip-Chip InGaN-GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
Office action for U.S. Appl. No. 12/573,820 (Oct. 11, 2011).
Office action for U.S. Appl. No. 12/749,466 (Feb. 3, 2012).
Office action for U.S. Appl. No. 13/046,565 (Feb. 2, 2012).
Office action for U.S. Appl. No. 13/046,565 (Nov. 7, 2011).
Office action for U.S. Appl. No. 12/484,924 (Oct. 31, 2011).
Office action for U.S. Appl. No. 12/497,289 (Feb. 2, 2012).
Office action for U.S. Appl. No. 12/759,273 (Nov. 21, 2011).
Office action for U.S. Appl. No. 12/762,269 (Oct. 12, 2011).
Office action for U.S. Appl. No. 12/762,271 (Dec. 23, 2011).
Office action for U.S. Appl. No. 12/778,718 (Nov. 25, 2011).
Notice of Allowance for U.S. Appl. No. 12/762,278 (Nov. 7, 2011).
Abare "Cleaved and Etched Facet Nitride Laser Diodes," IEEE Journal of Selected Topics in Quantum Electronics, vol. 4, No. 3, pp. 505-509 (May 1998).
Asif Khan "Cleaved cavity optically pumped InGaN-GaN laser grown on spinel substrates," Appl. Phys. Lett. 69 (16), pp. 2418-2420 (Oct. 14, 1996).
Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells,",Journal of Applied Physics vol. 91, No. 12, pp. 9904-9908 (Jun. 2002).
Romanov "Strain-induced polarization in wurtzite III-nitride semipolar layers," Journal of Applied Physics 100, pp. 023522-1 through 023522-10 (Jul. 25, 2006).
Schoedl "Facet degradation of GaN heterostructure laser diodes," Journal of Applied Physics vol. 97, issue 12, pp. 123102-1 to 123102-8 (2005).

* cited by examiner

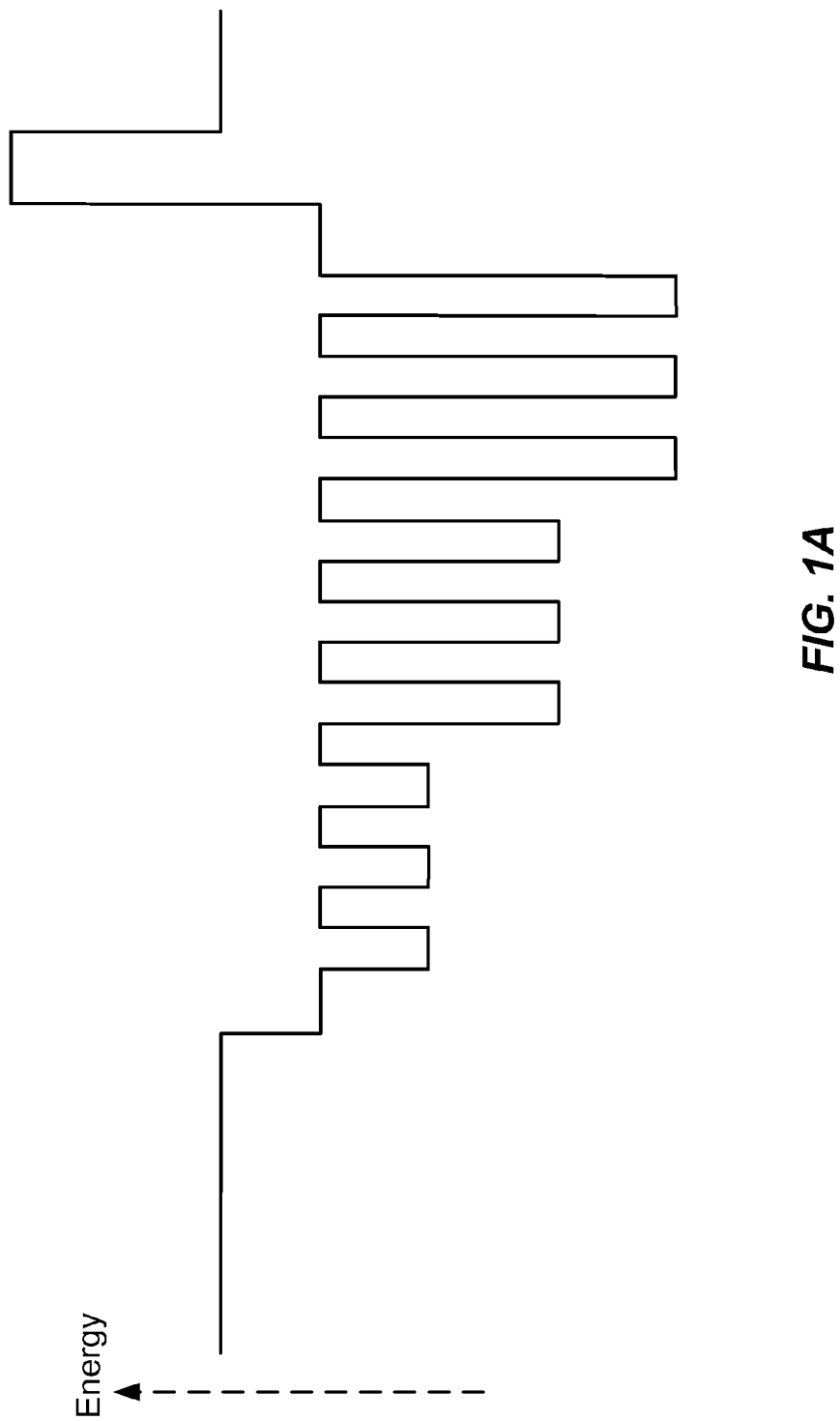

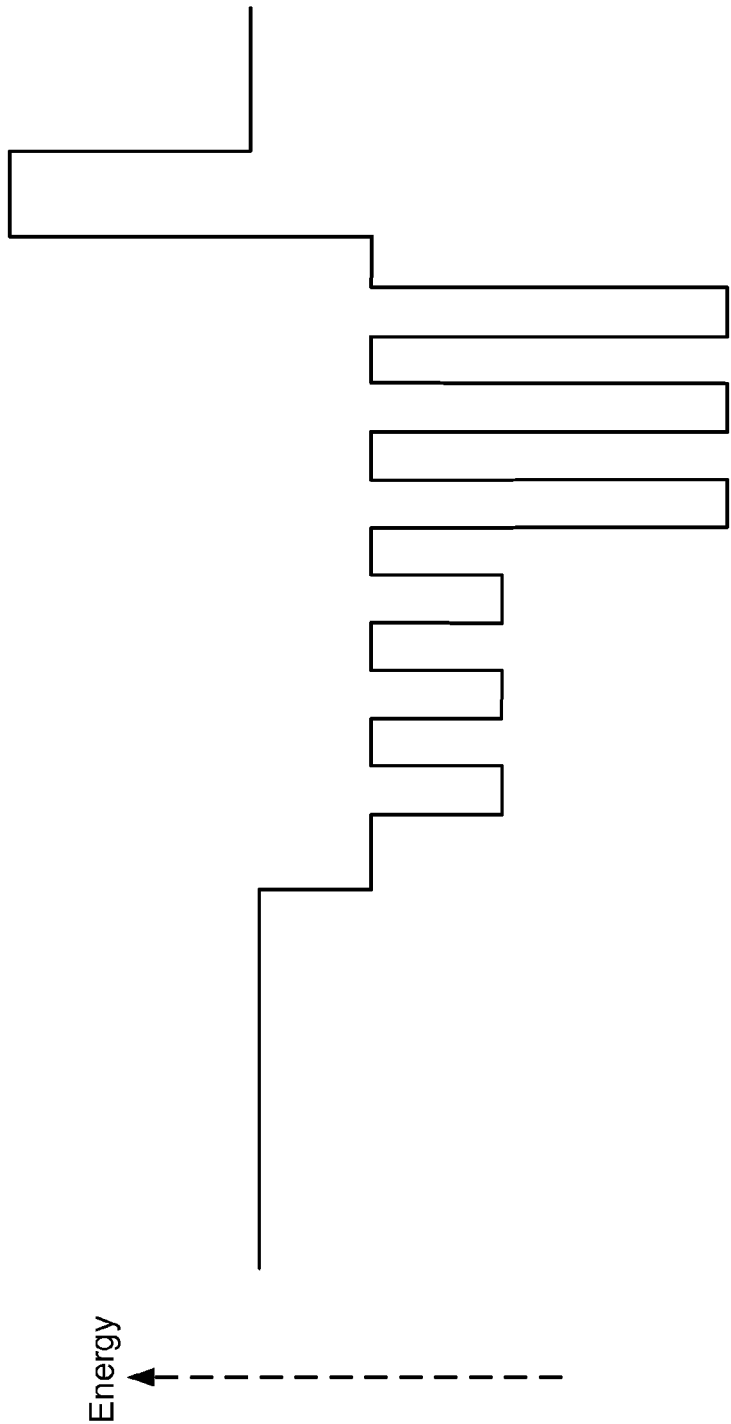

MULTI COLOR ACTIVE REGIONS FOR WHITE LIGHT EMITTING DIODE

CROSS-REFERENCE TO RELATED APPLICATION

This application claims priority to U.S. Provisional Patent Application No. 61/242,372, filed Sep. 14, 2009, which is incorporated by reference herein for all purposes.

BACKGROUND OF THE INVENTION

This invention relates generally to lighting techniques. More specifically, embodiments of the invention include techniques for combining one or more colored LED devices, such as violet, blue, blue and yellow, or blue and green, fabricated on semipolar or nonpolar materials, and optionally, with use of entities such as phosphors, which emit light. The invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, one drawback with the conventional Edison light bulb is that it dissipates much of the electricity supplied to it as thermal energy. More than 90% of the energy used for the conventional light bulb dissipates as thermal energy. Additionally, the conventional light bulb routinely fails often due to thermal expansion and contraction of the filament element.

Fluorescent lighting overcomes some of the drawbacks of the conventional light bulb. Fluorescent lighting uses an optically clear tube structure filled with a halogen gas and, typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been developed. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has lead scientists and engineers to the term "green gap" to describe the unavailability of such green LED. In addition, the light emission efficiency of typical GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although highly successful, solid state lighting techniques must be improved for full exploitation of their potential.

From the above, it is seen improved optical devices are desired.

BRIEF SUMMARY OF THE INVENTION

In a specific embodiment, this invention provides a light emitting diode device. The device includes a gallium and nitrogen containing substrate having a surface region. The device also includes an n-type epitaxial layer overlying the surface region. In a specific embodiment, the device has one or more first active regions overlying one or more portions of the surface region and being configured to first emit electromagnetic radiation having a wavelength ranging from about 405 nm to 490 nm; and one or more second active regions overlying one or more portions of the surface region and being configured to second emit electromagnetic radiation having a wavelength ranging from about 520 nm to about 620 nm. In a specific embodiment, the optical device also has a p-type epitaxial layer overlying the one or more first and second active regions.

In an alternative specific embodiment, the present invention provides a light emitting diode device. The device has a gallium and nitrogen containing substrate including a surface region. The device also has an n-type epitaxial layer overlying the surface region. In a specific embodiment, the device includes at least one or more second active regions overlying one or more portions of the surface region and being configured to emit first electromagnetic radiation having a wavelength ranging from about 405 nm to 490 nm; one or more second active regions overlying one or more portions of the surface region and being configured to emit second electromagnetic radiation having a wavelength ranging from about 491 nm to about 590 nm; and one or more third regions overlying one or more portions of the surface region and being configured to emit third electromagnetic radiation having a wavelength ranging from about 591 nm to about 700 nm. In a specific embodiment, the optical device has a p-type epitaxial layer overlying the one or more first, second, and third active regions.

In yet another alternative embodiment, the present invention provides a light emitting diode device. The device has a gallium and nitrogen containing substrate including a surface region. The device also includes an n-type epitaxial layer overlying the surface region. The device further includes one or more first active regions overlying one or more portions of the surface region. The first active regions are configured to first emit electromagnetic radiation having a wavelength ranging from about 405 nm to 490 nm. The device also includes one or more second active regions overlying one or more portions of the surface region. The second active regions are configured to second emit electromagnetic radiation having a wavelength ranging from about 520 nm to about 620 nm. The one or more second active regions are positioned above the one or more first active regions. The device also includes a p-type epitaxial layer overlying the one or more first and second active regions. In a preferred embodiment, the device further includes a barrier layer positioned between the first active regions and the second active regions. For example, the barrier layer comprises magnesium material.

One or more benefits may be achieved using one or more of the specific embodiments. As an example, the present device and method provides for an improved lighting technique with improved efficiencies. In other embodiments, the present method and resulting structure are easier to implement using conventional technologies. In some embodiments, the present device and method provide light at two or more wavelengths that are useful in displays. In a specific embodiment, the blue LED device is capable of emitting electromagnetic radiation at a wavelength range from about 450 nanometers to about 495 nanometers and the yellow-green LED device is capable of emitting electromagnetic radiation at a wavelength range from about 495 nanometers to about 590 nanometers, although there can also be some variations. Depending upon the embodiment, one or more of these benefits can be achieved. These and other benefits are further described throughout the present specification and more particularly below.

A further understanding of the nature and advantages of the present invention may be realized by reference to the specification and attached drawings.

BRIEF DESCRIPTION OF THE DRAWINGS

FIG. 1A is a simplified diagram of a conduction band of an RGB active region in phosphorless white LED on semipolar or nonpolar bulk GaN substrates according to an embodiment of the present invention.

FIG. 1B is a simplified diagram of a conduction band of a blue and yellow active region in phosphorless white LED on semipolar or nonpolar bulk GaN substrates according to an embodiment of the present invention.

DETAILED DESCRIPTION OF THE INVENTION

In a specific embodiment, the present invention includes a single growth epitaxial structure containing active layers that emit red, green, and blue radiation, or red, green, yellow, and blue radiation, or blue and yellow radiation from the same layer stack resulting in white light emission. The epitaxial structure is fabricated into an LED that emits white light without the need for a phosphor. See, for example, FIGS. 1A, 1B, and 1C and FIGS. 2A and 2B.

In a specific embodiment, the light emitting layers are formed from InGaN in which the indium content dictates the emission wavelength. The InGaN light emitting layers may be quantum wells separated by quantum barriers or may be double hetereostructures type emitting layers.

The emitting layers can be contained within the same p-i-n junction such that adjacent layers can be emitting different colors. Such a configuration would lead to an ideal diode turn-on voltage equal to the largest bandgap of the emitting layers. In order to balance the color characteristics of the integrated emission, careful design of the active region would be necessary. Design aspects would include thickness and number of the emitting layers generating the various colors, the distance the light generating layers are separated from one another, i.e., the barrier thicknesses), the arrangement of the emitting layers, and the addition of doping species to various layers in the active region. For example, in general InGaN layers emitting in the blue region tend to emit more light for a given current than InGaN layers emitting in the green, yellow, or red regions. Thus one strategy would be to increase the number of emitting layers in the green, yellow, and red relative to blue to help balance the color.

In certain embodiments, emission layers are positioned based on their bandgap characteristics. For example, the lower bandgap (longer wavelength) light emitting layers are placed below the higher bandgap light emitting layers for better performed compared to other configurations. In various embodiments, barrier layers between the lighting emitting layers are doped with various type of materials, thereby allowing tuning of the relative brightness of the emitting layers. For example, magnesium material is used for doping the barrier layer. The barrier layers allows for better color control. During the tuning process, to achieve the desired color balance, it is possible to make one of the colors relatively brighter than the other.

Figure 1C:
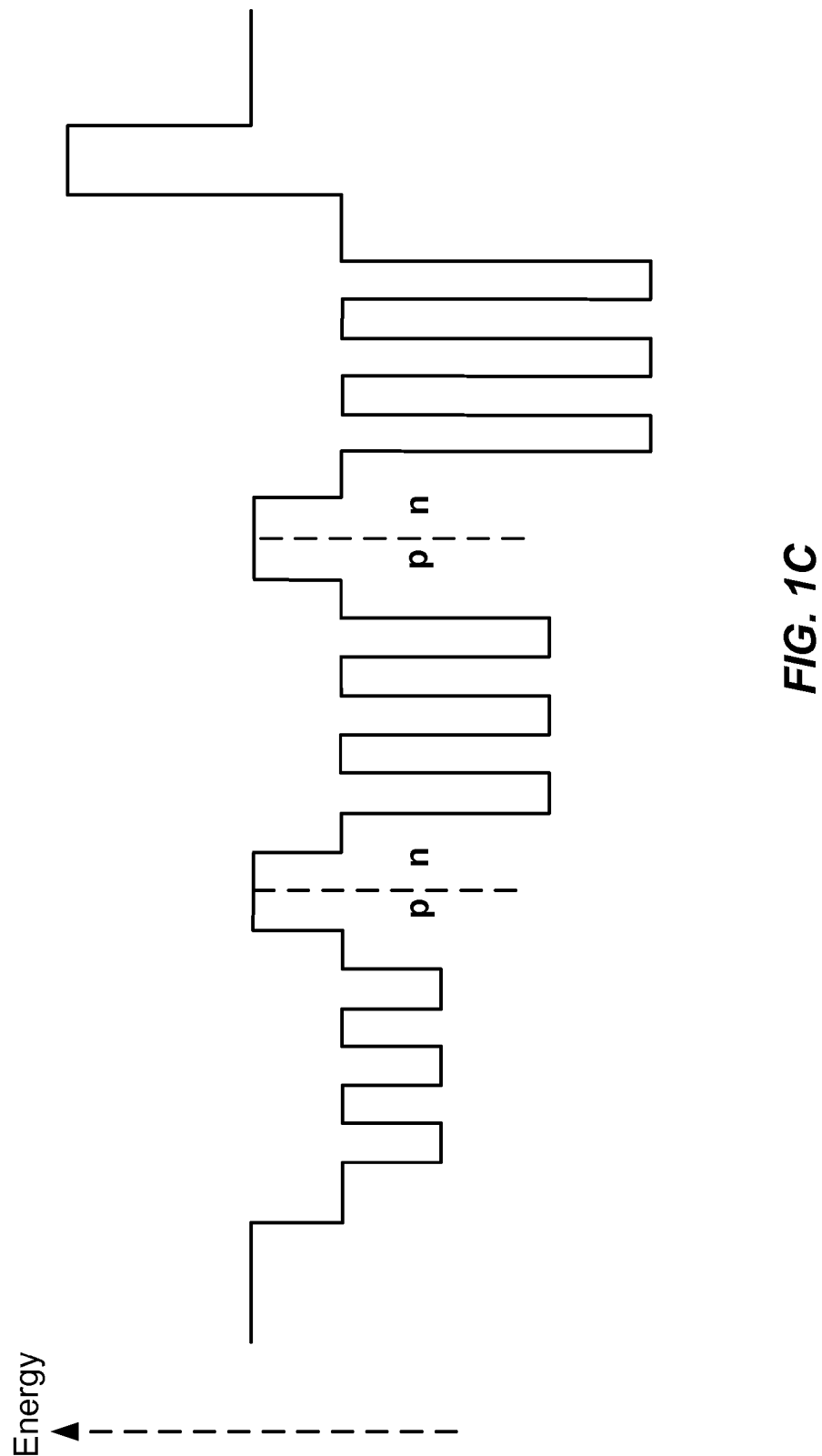
FIG. 1C is a simplified diagram of a conduction band of an RGB tunnel junction based active region in phosphorless white LED on semipolar or nonpolar bulk GaN substrates according to an embodiment of the present invention.
Figure 2A:
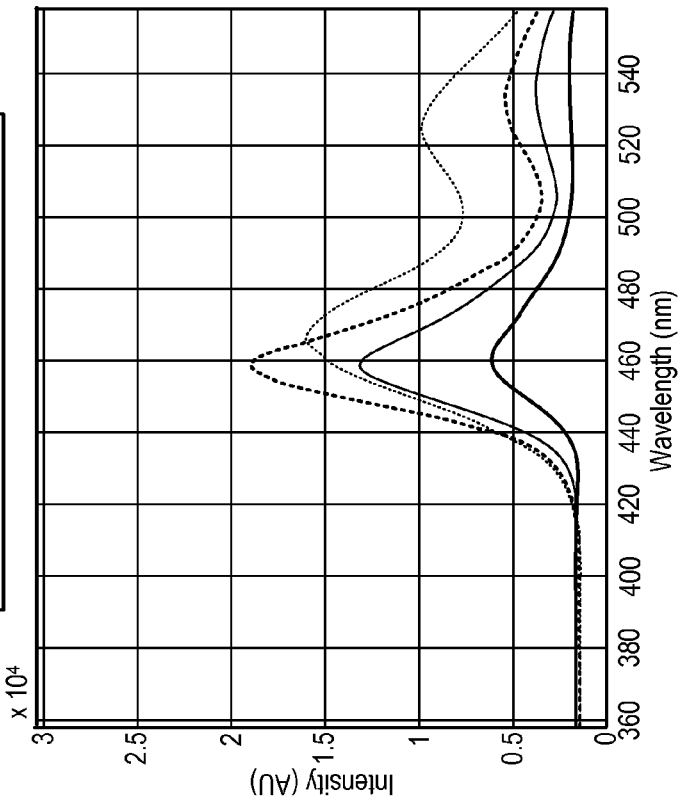
FIG. 2A illustrates experimental results showing electroluminescence from multi-color active regions according to an embodiment of the present invention.
Figure 2A:
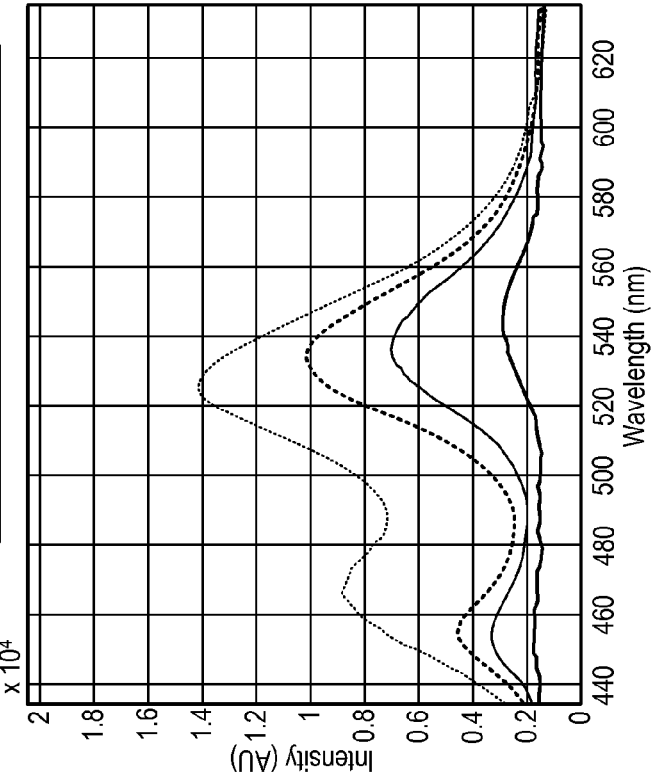
Figure 2B:
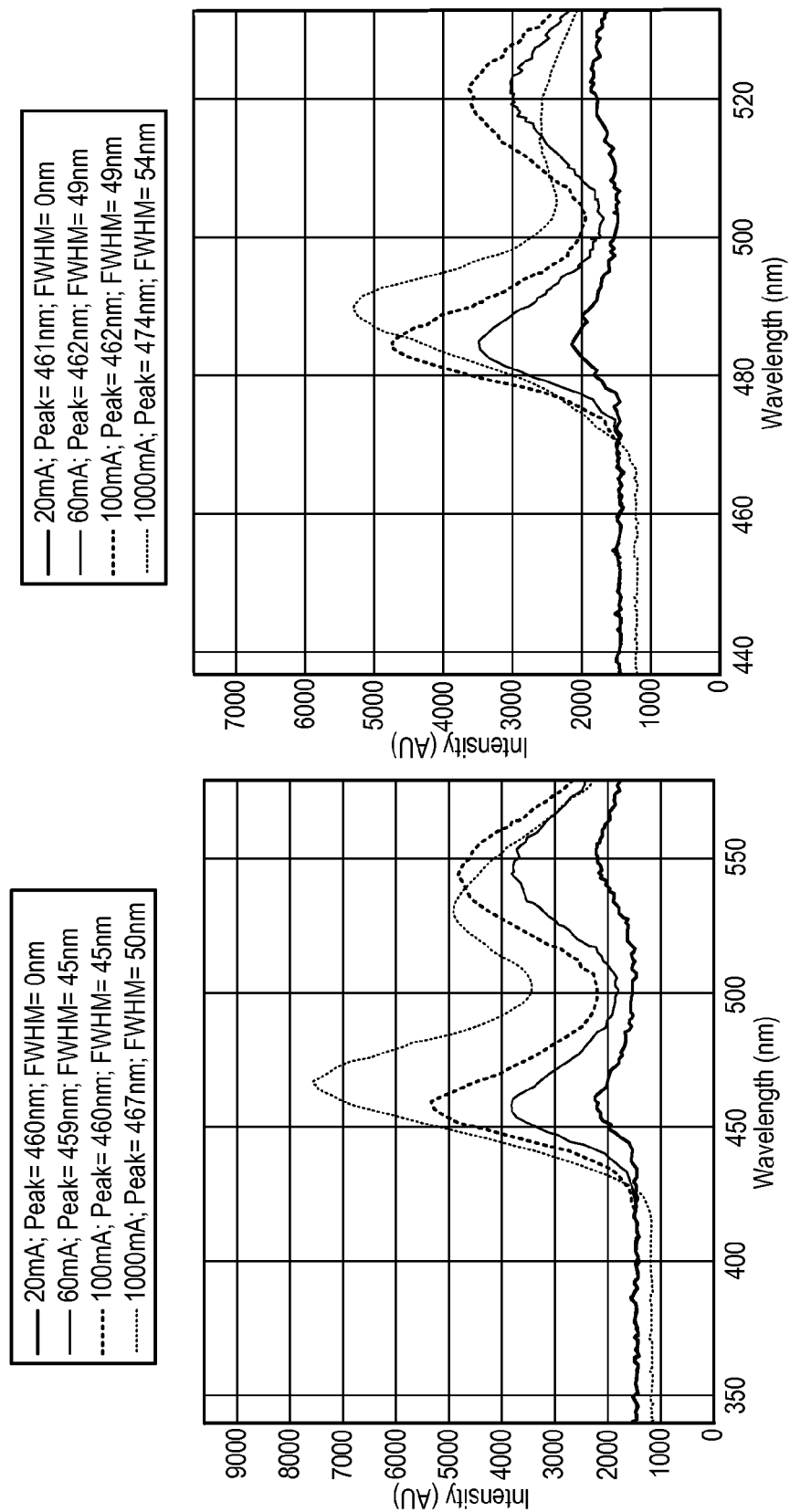
FIG. 2B illustrates experimental results showing electroluminescence from multi-color active regions according to an embodiment of FIG. 1B of the present invention.

In a separate embodiment regions containing the emitting layers could be coupled together with tunnel junctions, as referenced in FIG. 1C. Such a configuration would offer an ideal turn-on voltage equal to the sum of the bandgap voltages of the different emitting regions, but may offer better light emission properties since carrier filling of the emitting layers may be more uniform. Design aspects would include thickness and number of the emitting layers generating the various colors, the distance the light generating layers are separated from one another, i.e., the barrier thicknesses, the arrangement of the emitting layers, and the addition of doping species to various layers in the active region.

Layers to prevent electron overflow from the light emitting regions such as AlGaN electron blocking layers can be inserted into the structures with various compositions, doping, and thickness.

The epitaxial device structure would use a thin (5-200 nm) p-cladding region grown on top of the emitting regions. Ultra thin layers in the range of 5-50 nm grown at temperatures equal to or slightly hotter than the growth temperature used for the light emitting layers would mitigate degradation to the light emitting layers while offering low resistance to current injected into the LED emitting layers. Conducting oxide layers such as indium-tin-oxide (ITO) or zinc oxide (ZnO) would then be deposited directly in contact with the think p-cladding layer. These conducting oxide layers can be deposited at a lower temperature relative to typical p-GaN growth conditions, and may therefore allow for the formation of a p-contact layer that results in ohmic or quasi-ohmic characteristics, at temperatures which would mitigate degradation of the light emitting layers. Additionally, the conducting oxide layers can have optical absorption coefficients at the wavelength ranges of interest which are lower or significantly lower than the optical absorption coefficient of a typical highly doped p-type GaN contact layer, and may therefore help to reduce absorption of emitted light within the device structure. In an alternative embodiment, metallic layers such as silver may be used in place of conducting oxide layers.

Figure 3A:
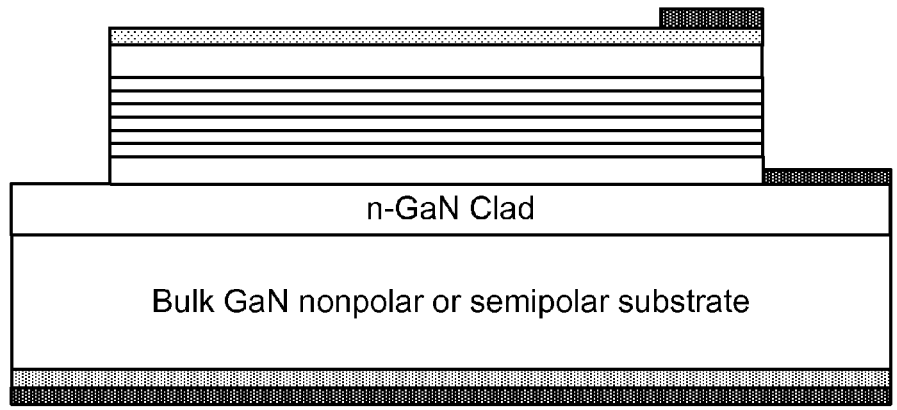
FIG. 3A is a simplified top-side emitting phosphorless white LED on semipolar or nonpolar bulk GaN substrates according to an embodiment of the present invention.

One device embodiment would be a top-side emitting LED, as illustrated by way of FIG. 3A. In this case a transparent conducting material such as indium-tin-oxide (ITO) or zinc oxide (ZnO) would be used as the p-electrode. This contact would offer low voltage and low absorption loss to the emitted light. This device would contain some sort of reflector on the bottom of the chip to reflected downward emitted light back up through the topside to increase light extraction. The device may have a vertical electrical conduction path (one top-side p-contact and one bottom-side n-contact) or a lateral electrical conduction path (two top-side contacts). The reflector layer may be formed on the bottom of the chip, or may be formed on the submount to which the chip is attached. In this latter case, the chip is attached to the submount using a die-attach silicone or epoxy which is optically transparent at the wavelength range of interest. The reflector layer may be metallic, or may be formed of a multi-layer dielectric stack. Further, the top and/or bottom surface of the device as well as the edges of the device may be suitably textured or roughened in order to increase light extraction from the chip. The thickness and lateral dimensions of the chip may be suitably chosen so as to minimize absorption of the emitted light and to enhance extraction. In a specific embodiment, the present optical device and related method can be configured in one or more packages.

Figure 3B:
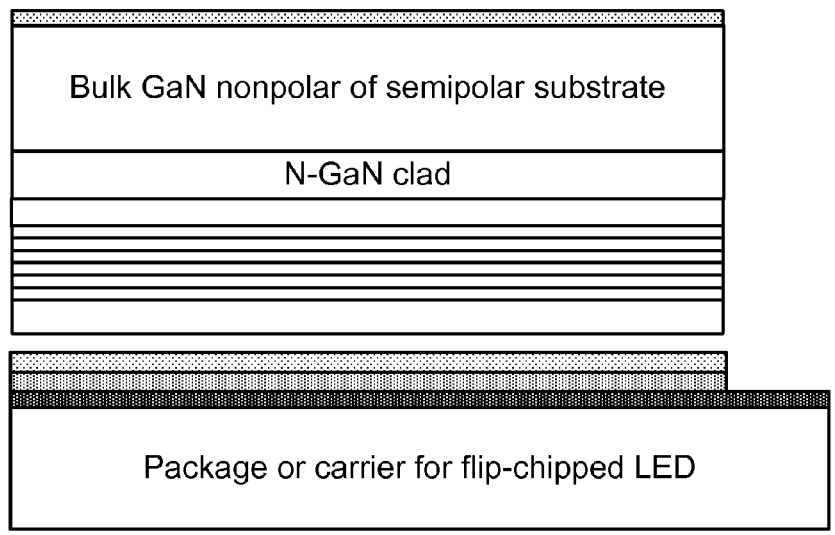
FIG. 3B is a simplified bottom-side emitting phosphorless white LED on semipolar or nonpolar bulk GaN substrates according to an embodiment of the present invention.

An alternative device embodiment would be a bottom-side emitting LED in which the LED chip is flipped and mounted with p-side down, as illustrated by way of FIG. 3B. In this case, a transparent conducting material such as indium-tin-oxide (ITO) or zinc oxide (ZnO) may be used as the p-electrode, and a suitable reflector may be placed adjacent to this layer in order to reflect downward emitted light back up through the topside to increase light extraction. In an alternative embodiment, a metallic reflector layer may be placed in direct contact with the p-type semiconductor layer to form a low voltage contact. The device may have a vertical electrical conduction path (one top-side n-contact and one large-area bottom-side p-contact) or a lateral electrical conduction path (two bottom-side contacts). Further, the top and/or bottom surface of the device as well as the edges of the device may be suitably textured or roughened in order to increase light extraction from the chip. The thickness and lateral dimensions of the chip may be suitably chosen so as to minimize absorption of the emitted light and to enhance extraction.

Although the above has been described in terms of an embodiment of a specific package, there can be many variations, alternatives, and modifications. As an example, the LED device can be configured in a variety of packages such as cylindrical, surface mount, power, lamp, flip-chip, star, array, strip, or geometries that rely on lenses (silicone, glass) or sub-mounts (ceramic, silicon, metal, composite). Alternatively, the package can be any variations of these packages.

In other embodiments, the packaged device can include one or more other types of optical and/or electronic devices. As an example, the optical devices can be OLED, a laser, a nanoparticle optical device, and others. In other embodiments, the electronic device can include an integrated circuit, a sensor, a micro-electro-mechanical system, or any combination of these, and the like.

In a specific embodiment, the packaged device can be coupled to a rectifier to convert alternating current power to direct current, which is suitable for the packaged device. The rectifier can be coupled to a suitable base, such as an Edison screw such as E27 or E14, bipin base such as MR16 or GU5.3, or a bayonet mount such as GU10, or others. In other embodiments, the rectifier can be spatially separated from the packaged device.

Additionally, the present packaged device can be provided in a variety of applications. In a preferred embodiment, the application is general lighting, which includes buildings for offices, housing, outdoor lighting, stadium lighting, and others. Alternatively, the applications can be for display, such as those used for computing applications, televisions, projectors, micro-, nano-, or pico-projectors, flat panels, microdisplays, and others. Still further, the applications can include automotive, gaming, and others.

Figure 4:
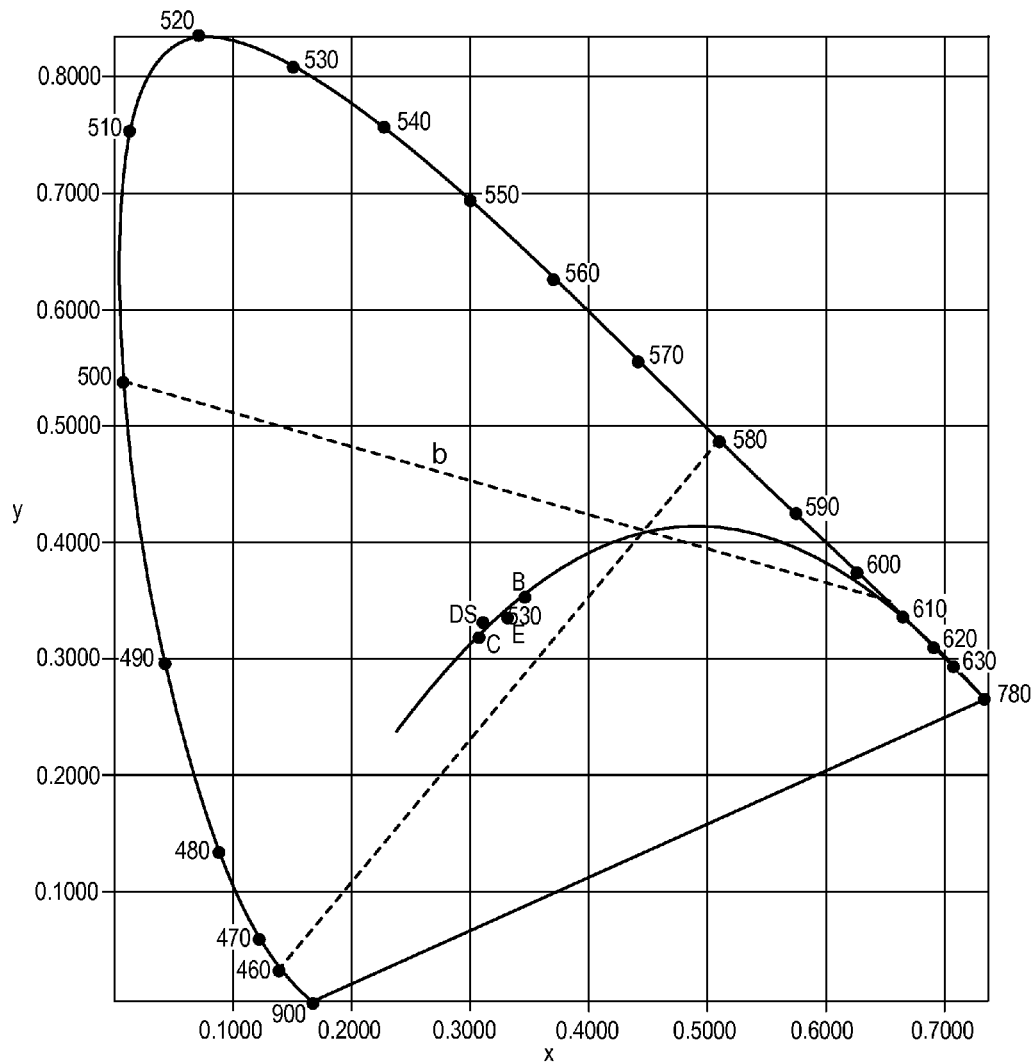
FIG. 4 is a chromaticity diagram according to an embodiment of the present invention.

FIG. 4 is a chromaticity diagram according to an embodiment of the present invention. As shown, the chromaticity diagram shows tie lines illustrating loci of phosphorous-free white light emitting diode devices, as shown. Referring to line "b," blue quantum wells emitting at 460 nm coupled with yellow quantum wells emitting at 580 nm yields a warm white light emitting diode device at 2850K. Referring to line "a," green quantum wells emitting at 500 nm coupled with red quantum wells emitting at 605 nm yields a warm white light emitting diode device at 2850K.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A light emitting diode device comprising:
   a gallium and nitrogen containing substrate having a surface region;
   an n-type epitaxial layer overlying the surface region;
   at least one first active region overlying at least one portion of the surface region and being configured to first emit electromagnetic radiation having a wavelength ranging from about 405 nm to 490 nm;
   at least one second active region overlying at least one portion of the surface region and being configured to second emit electromagnetic radiation having a wavelength ranging from about 520 nm to about 620 nm, the at least one second active regions being positioned above the at least one first active regions;
   a p-type epitaxial layer overlying the at least one first and second active regions; and
   a barrier layer positioned between the first active region and the second active region.

2. The device of claim 1 wherein the barrier layer comprises magnesium material.

3. The device of claim 1, wherein the at least one first active region comprises a first indium containing material.

4. The device of claim 1, wherein the at least one second active region comprises a second indium containing material.

5. The device of claim 1, wherein the first electromagnetic radiation is characterized by a blue color and the second electromagnetic radiation is characterized by a yellow color.

6. The device of claim 1, wherein the at least one first active region and the at least one second active region are configured in a stacked configuration.

7. The device of claim 1, wherein the first electromagnetic radiation and the second electromagnetic radiation combine to form substantially white light.

8. The device of claim 1, wherein the surface region is oriented in a polar configuration.

9. The device of claim 1, wherein the surface region is oriented in a non-polar configuration.

10. The device of claim 1, wherein the surface region is oriented in a semi-polar configuration.

11. The device of claim 1, comprising at least one third region overlying at least one portion of the surface region and being configured to emit third electromagnetic radiation having a wavelength ranging from about 591 nm to about 700 nm.

12. The device of claim 11, wherein the at least one third active region comprise third indium containing material.

13. The device of claim 11, wherein the at least one first active region, the at least one second active region, and the at least one third active region are configured in a stacked configuration.

14. The device of claim 11, wherein the first electromagnetic radiation, the second electromagnetic radiation, and third electromagnetic radiation combine to emit substantially white light.

15. The device of claim 1, further comprising at least one tunnel junction region between the at least one first and the at least one second active region.

16. The device of claim 11, further comprising at least one tunnel junction region between the at least one second and the at least one third active region.

* * * * *